(12) United States Patent
Alhussien et al.

(10) Patent No.: US 9,086,984 B2
(45) Date of Patent: Jul. 21, 2015

(54) DETECTION AND DECODING IN FLASH MEMORIES WITH SELECTIVE BINARY AND NON-BINARY DECODING

(71) Applicant: LSI Corporation, San Jose, CA (US)

(72) Inventors: Abdel Hakim S. Alhussien, San Jose, CA (US); Zongwang Li, Dublin, CA (US); Erich F. Haratsch, Bethlehem, PA (US); Ludovic Danjean, Tucson, AZ (US)

(73) Assignee: Seagate Technology LLC, Cupertino, CA (US)

( * ) Notice: Subject to any disclaimer, the term of this patent is extended or adjusted under 35 U.S.C. 154(b) by 330 days.

(21) Appl. No.: 13/755,717

(22) Filed: Jan. 31, 2013

(65) Prior Publication Data

US 2013/0145235 A1    Jun. 6, 2013

Related U.S. Application Data

(63) Continuation-in-part of application No. 12/920,407, filed on Jan. 4, 2011, now Pat. No. 8,724,381, and a continuation-in-part of application No. 13/063,888, filed on Aug. 31, 2011, now Pat. No. 8,830,748, and a continuation-in-part of application No. 13/063,895, filed on May 31, 2011, and a continuation-in-part of application No. 13/063,899, filed on May 31, 2011, now Pat. No. 8,892,966, and a continuation-in-part of application No. 13/063,874, filed on Mar. 14, 2011, and a continuation-in-part of application No. 13/731,551, filed on Dec. 31, 2012.

(51) Int. Cl.
*G11C 11/34* (2006.01)
*G06F 11/10* (2006.01)
*G11C 8/12* (2006.01)
*G11C 11/56* (2006.01)

(52) U.S. Cl.
CPC ........ *G06F 11/1008* (2013.01); *G06F 11/1048* (2013.01); *G11C 8/12* (2013.01); *G11C 11/5621* (2013.01)

(58) Field of Classification Search
CPC ....... G11C 11/5642; G11C 16/26; G11C 7/02
USPC .......................... 365/185.03, 185.33, 185.11
See application file for complete search history.

(56) References Cited

U.S. PATENT DOCUMENTS

2011/0225350 A1* 9/2011 Burger et al. .................. 711/103
2013/0176778 A1* 7/2013 Chen et al. ................ 365/185.03
2014/0108891 A1* 4/2014 Strasser et al. ........... 365/185.03

FOREIGN PATENT DOCUMENTS

WO    WO 2008/075351    6/2008
WO    WO 2010/039874    4/2010

* cited by examiner

*Primary Examiner* — Tuan T Nguyen
(74) *Attorney, Agent, or Firm* — Ryan, Mason & Lewis, LLP

(57) ABSTRACT

Methods and apparatus are provided for detection and decoding in flash memories with selective binary and non-binary decoding. Data from a flash memory device is processed by obtaining one or more read values for a plurality of bits from one or more pages of the flash memory device; converting the one or more read values for the plurality of bits to a non-binary log likelihood ratio based on a probability that a given data pattern was written to the plurality of bits when a particular pattern was read from the plurality of bits; and jointly decoding the plurality of bits using the non-binary log likelihood ratio, wherein the pages are encoded independently.

27 Claims, 11 Drawing Sheets

| a\r_j | 0 | 1 | 2 | 3 |
|---|---|---|---|---|
| 0 | 0 | $-\alpha$ | $-\alpha$ | $-\alpha$ |
| 1 | $-\alpha$ | 0 | $-\alpha$ | $-\alpha$ |
| 2 | $-\alpha$ | $-\alpha$ | 0 | $-\alpha$ |
| 3 | $-\alpha$ | $-\alpha$ | $-\alpha$ | 0 |

| a\r_j | 0 | 1 | 2 | 3 |
|---|---|---|---|---|
| 0 | 0 | $-\alpha$ | $-\alpha$ | $-2\alpha$ |
| 1 | $-\alpha$ | 0 | $-2\alpha$ | $-3\alpha$ |
| 2 | $-\alpha$ | $-2\alpha$ | 0 | $-\alpha$ |
| 3 | $-2\alpha$ | $-3\alpha$ | $-\alpha$ | 0 |

DETECTION AND DECODING IN FLASH MEMORIES WITH SELECTIVE BINARY AND NON-BINARY DECODING

CROSS-REFERENCE TO RELATED APPLICATIONS

The present application is a continuation-in-part patent application of U.S. patent application Ser. No. 12/920,407, filed Jan. 4, 2011, entitled "Methods and Apparatus for Storing Data in a Multi-Level Cell Flash Memory Device With Cross-Page Sectors, Multi-Page Coding And Per-Page Coding;" U.S. patent application Ser. No. 13/063,888, filed Aug. 31, 2011, entitled "Methods and Apparatus for Soft Data Generation in Flash Memories;" and U.S. patent application Ser. No. 13/063,895, filed May 31, 2011, entitled "Methods and Apparatus for Soft Data Generation for Memory Devices Using Reference Cells;" U.S. patent application Ser. No. 13/063,899, filed May 31, 2011, entitled "Methods and Apparatus for Soft Data Generation for Memory Devices Using Decoder Performance Feedback;" and U.S. patent application Ser. No. 13/063,874, filed Mar. 14, 2011, entitled "Methods and Apparatus for Soft Data Generation for Memory Devices Based on Performance Factor Adjustment;" and U.S. patent application Ser. No. 13/731,551, filed Dec. 31, 2012, entitled "Multi-Tier Detection and Decoding in Flash Memories," each incorporated by reference herein.

FIELD OF THE INVENTION

The present invention relates generally to flash memory devices and more particularly, to improved techniques for mitigating the effect of noise, inter-cell interference (ICI) and other distortions in such flash memory devices with low overall processing delay.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

The analog values stored in memory cells are often distorted. The distortions are typically due to, for example, back pattern dependency (BPD), noise and inter-cell interference (ICI). A number of techniques have been proposed or suggested for mitigating the effect of ICI by reducing the capacitive coupling between cells. While there are available methods to reduce the effect of ICI, it is important that such ICI mitigation techniques do not unnecessarily impair the write-read speeds for flash read channels. Thus, many effective signal processing and decoding techniques are avoided that would introduce significant inherent processing delays. Foregoing such complex signal processing techniques, however, reduces the ability of the read channel designer to maintain sufficient decoding accuracy as flash device geometries scale down.

The smallest writable data unit in a flash memory device is referred to as a page. A page can comprise several codewords of a read channel error correction code (ECC), which is the smallest readable data unit. Depending on the mapping of page bits into memory cell voltages, there is usually a significant statistical correlation among errors in pages mapped to the same wordline. Thus, it has been recognized that there are benefits to coding across multiple pages. In order to maintain high write and read speeds in flash memory devices, however, pages are typically written and decoded on-the-fly, independently from other pages. A need therefore exists for an ECC design in which pages are encoded independently and where a page is decoded on-the-fly in a normal mode of operation, while also supporting decoding of a wordline comprised of multiple pages if a page failure occurs to improve the probability of recovering the failing page.

SUMMARY OF THE INVENTION

Generally, methods and apparatus are provided for detection and decoding in flash memories with selective binary and non-binary decoding. According to one embodiment of the invention, data from flash memory device is processed by obtaining one or more read values for a plurality of bits from one or more pages of the flash memory device; converting the one or more read values for the plurality of bits to a non-binary log likelihood ratio based on a probability that a given data pattern was written to the plurality of bits when a particular pattern was read from the plurality of bits; and jointly decoding the plurality of bits using the non-binary log likelihood ratio, wherein the pages are encoded independently.

A more complete understanding of the present invention, as well as further features, aspects, embodiments and advantages of the present invention, will be obtained by reference to the following detailed description, claims and drawings.

BRIEF DESCRIPTION OF THE DRAWINGS

FIGS. 12A and 12B indicate symbol independent mapping and symbol dependent mapping for use in mapping LLRs.

DETAILED DESCRIPTION

Figure 1:
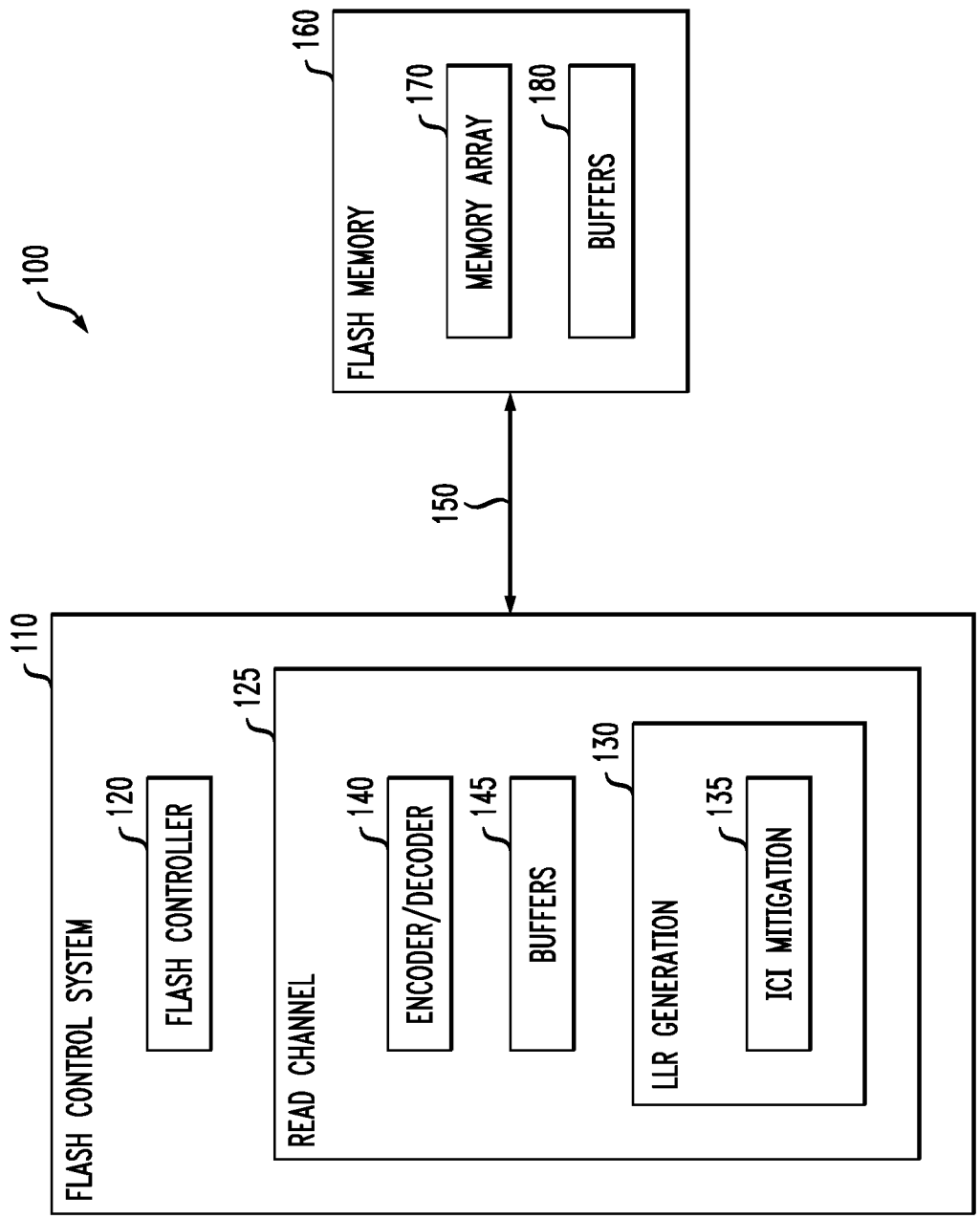
FIG. 1 is a schematic block diagram of an exemplary flash memory system incorporating detection and decoding techniques in accordance with the present invention.

Various aspects of the invention are directed to signal processing techniques, and in particular detection and coding techniques for mitigating ICI and other distortions in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages or currents to represent stored data, as would be apparent to a person of ordinary skill in the art.

Aspects of the present invention provide detection and decoding techniques with error processing that do not unnecessarily impair the read speeds for flash read channels. According to one aspect of the invention, detection and decoding techniques are provided that account for error correlations between neighboring bits. A log likelihood ratio (LLR) for a given bit is generated in a normal mode based on a probability that a given data pattern was written to one or more bits when a particular pattern was read. A log likelihood ratio is generated in a normal mode based on a probability that a given data pattern was written to a plurality of bits when a particular pattern was read from the plurality of bits. As used herein, the term "ICI mitigation" includes the mitigation of ICI and other distortions. Also, the term "LLR" includes also an approximation of an LLR, reliability value or other measures for reliability.

According to one aspect of the invention, tin led pages in a flash device rim be recovered by joint decoding of multiple pages in a given wordline even if the individual pages are encoded independently. Aspects of the invention recognize that as long as pages are encoded using the same binary generator matrix, the corresponding individual parity check matrices for decoding can be joined into a single non-binary parity check matrix given that all its nonzero elements are the unity Galois field element, as discussed further below. Moreover, although an example is given here only for two pages per wordline, the same approach can be applied by anyone with ordinary skill in the an to any number of pages per wordline, by replicating binary LDPC decoders so that the number of decoders equals the number of pages. In addition, the same approach can be applied to any number of pages in different wordlines that are correlated in any measurable way.

In one exemplary embodiment, a given page is independently decoded on-the-fly during a normal operating mode using the parity check matrix that corresponds to the given page. If the page fails to decode during the normal mode, then additional pages in the same wordline are read, and the symbol reliabilities for the wordline are generated and passed to the LDPC decoder. In another embodiment, when a page fails to decode in the normal mode, additional pages in other wordlines are also read that cause ICI in the current wordline, and the symbol probabilities are passed to the LDPC decoder. According to a further aspect of the invention, the LDPC decoder is a hybrid decoder that supports both individual page decoding and joint wordline decoding due to the structure of the disclosed non-binary parity check matrix.

FIG. 1 is a schematic block diagram of an exemplary flash memory system 100 incorporating noise and ICI mitigation techniques in accordance with aspects of the present invention. As shown in FIG. 1, the exemplary flash memory system 100 comprises a flash control system 110 and a flash memory block 1 (50, connected by an interface 150. The exemplary flash control system 110 comprises a flash controller 120, and a read channel 125. Moreover, the read channel 125 further comprises an encoder/decoder 140, buffers 145 and an LLR generation block 130. Finally, the LLR generation block 130 further comprises an ICI mitigation block 135.

As discussed further below in conjunction with FIG. 4, the exemplary flash controller 120 implements one or more detection and decoding processes (discussed further below in conjunction with FIGS. 5-7) that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention.

Generally, as discussed further below in conjunction with FIGS. 4-7, the exemplary LLR generation block 130 processes one or more read values from the flash memory 160, such as single bit hard values and/or quantized multi-bit soft values, and generates LLR values that are applied to the decoder 140, such as an exemplary low density parity check (LDPC) decoder.

Generally, as discussed further below in conjunction with FIGS. 4-7, the exemplary ICI mitigation block 135 is a specialized function in the LLR generation block 130 that accounts for interference between physically adjacent cells in generating the LLR sequence.

The exemplary flash memory block 160 comprises a memory array 170 and one or more buffers ISO that may each be implemented using well-known commercially available techniques and/or products.

In various embodiments of the disclosed detection and decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to the flash controller 120 in a sequential manner which would incur additional delays. However those additional delays do not notably increase the overall delay due to their rare occurrence. When additional capacity is desired, the interface 150 may optionally be implemented, for example, in accordance with the teachings of International PCT Patent Application Serial No. PCT/US09/49328, filed Jun. 30, 2009, entitled "Methods and Apparatus for Interfacing Between a Flash Memory Controller and a Flash Memory Array", incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36110, filed Mar. 11, 2009, entitled "Methods and Apparatus for Storing Data in a Multi-Level Cell Flash Memory Device with Cross-Page Sectors, Multi-Page Coding, and Per-Page Coding," incorporated by reference herein.

During a read operation, the interface 150 transfers hard and/or soil read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed detection and decoding techniques are implemented outside the flash memory 160, typically in a process technology optimized for logic circuits to achieve the lowest area. It is at the expense, however, of the additional aggressor cell data that must be transferred on the interface 150.

Figure 2:
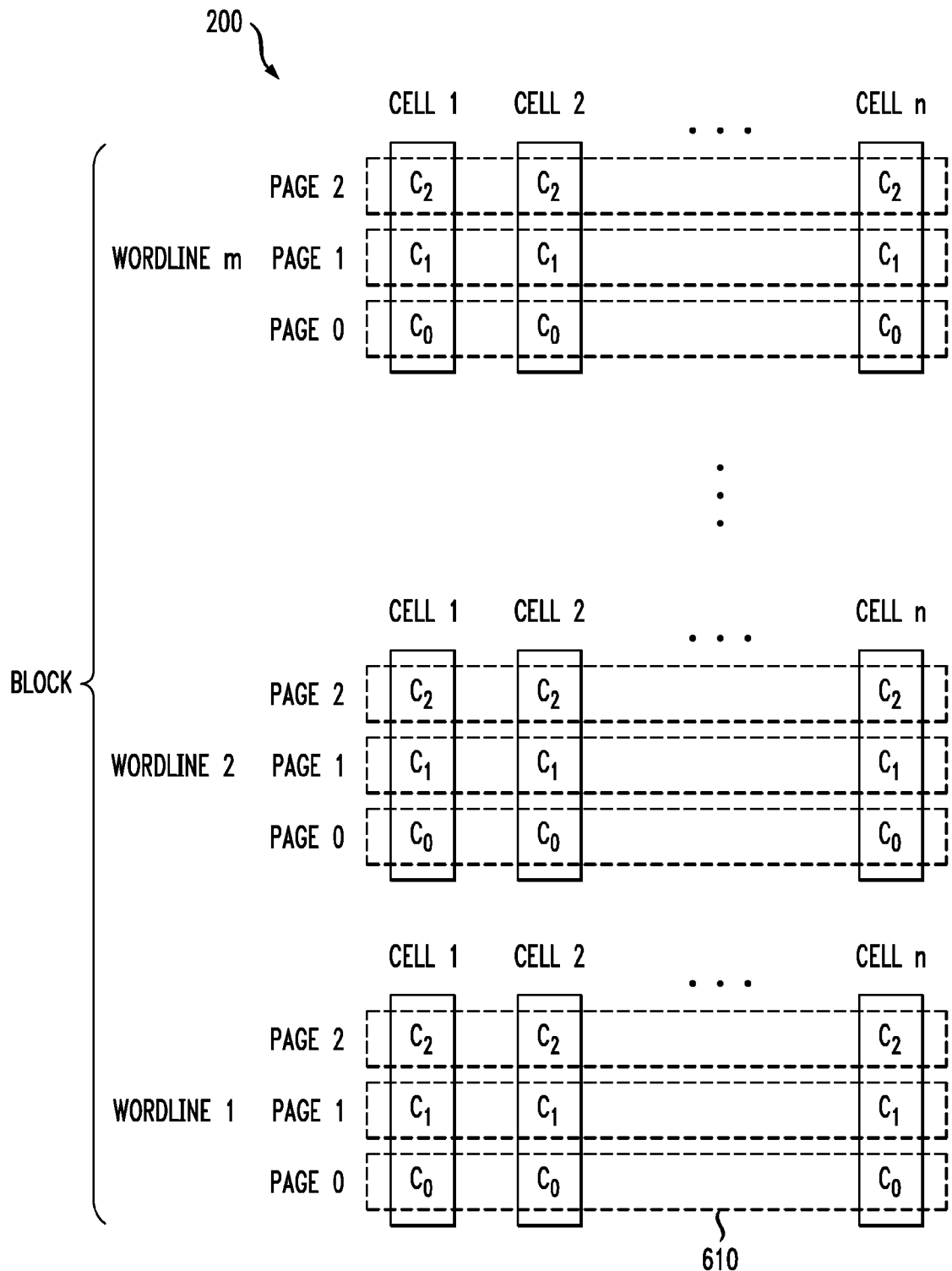
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memories, the bits within a single cell belong to different pages. In the example of FIG. 2, the three bits for each cell correspond to three different pages, and each wordline stores three pages. In the following, discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 2) correspond to even pages, and cells with odd numbers (such as cells 1 and 3 in FIG. 2) correspond to odd pages. In this case, a page (such as page 0) would contain an even page (even page 0) in even cells and an odd page (odd page 0) in odd cells.

In a two-level cell, for example, each cell stores two bits. In one exemplary implementation, Gray mapping {11, 01, 00, 10} is employed where bits in a cell belong to two different pages. The bits for the two pages in each cell are often referred to as the least significant bit (LSB) and the most significant bit (MSB). For example, for the pattern 01 that is stored in a two-bit-per-cell flash cell, "1" refers to the LSB or lower page, and "0" refers to the MSB or upper page. Experimental studies of flash memory devices indicate that the error event "01"→"10" has considerable occurrence probability at the end of device life. In addition, based on an additive white Gaussian noise (AWGN) model, the MSB pave often exhibits a higher bit error rate (BER) compared to the LSB page. Thus, it has been found that reading one page improves the HER of the other.

Thus, MSB and LSB errors are known to have statistical correlation at the end of device life relative to a new flash memory device. Thus, aspects of the present invention provide joint decoding on a non-binary field of LSB and MSB pages of a given wordline in the recovery mode, while also being able to decode LSB and MSB pages independently on the binary field in the normal mode.

Intercell Interference

Figure 3:
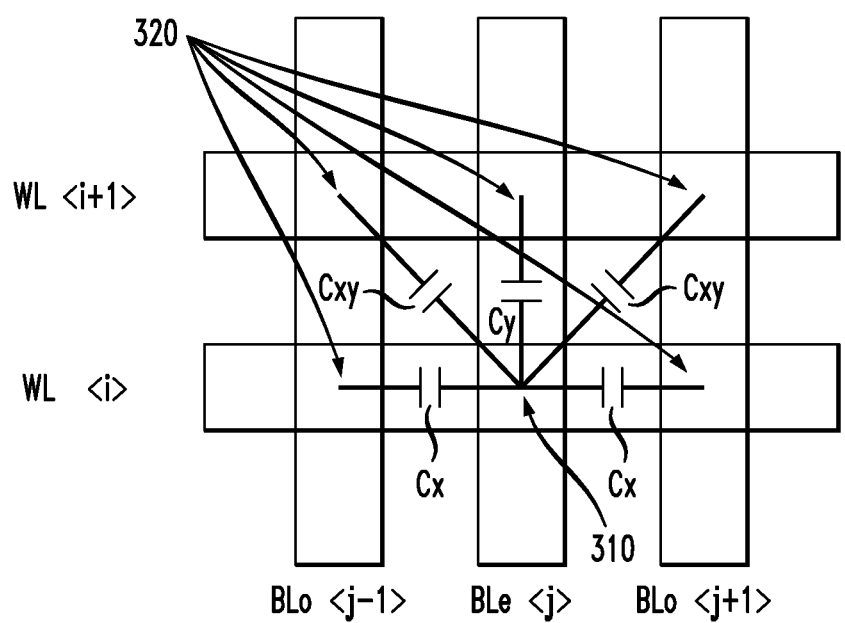
FIG. 3 illustrates the ICI that is present for a target cell due to the parasitic capacitance from a number of exemplary aggressor cells.

ICI is a consequence of parasitic capacitances between cells and is generally considered to be one of the most prominent sources of distortion. FIG. 3 illustrates the ICI that is present for a target cell 310 due to the parasitic capacitance from a number of exemplary aggressor cells 320. The following notations are employed in FIG. 3:
WL: wordline:
BL: bitline;
BLo: odd bitline,
BLe: even bitline; and
C: capacitance.

Aspects of the present invention recognize that ICI is caused by aggressor cells 320 that are programmed after the target cell 310 has been programmed. The ICI changes the voltage, $V_t$, of the target cell 310. In one exemplary embodiment, a "bottom up" programming scheme is assumed and adjacent aggressor cells in wordlines i and i+1 cause ICI for the target cell 310. With such bottom-up programming of a block, ICI from the lower wordline i−1 is removed, and up to five neighboring cells contribute to 10 as aggressor cells 320, as shown in FIG. 3. It is noted, however, that the techniques disclosed herein can be generalized to cases where aggressor cells from other wordlines, such as wordline −1, contribute to ICI as well, as would be apparent to a person of ordinary skill in the art. If aggressor cells from wordlines i−1, i and i+1 contribute to ICI, up to eight closest neighboring cells are considered. Other cells that are further away from the target cell can be neglected, if their contribution to ICI is negligible. In general, the aggressor cells 320 are identified by analyzing, the programming sequence/scheme (such as bottom up or even/odd techniques) to identify the aggressor cells 320 that are programmed after a given target cell 310.

The ICI caused by the aggressor cells 320 on the target cell 110 can be modeled in the exemplary embodiment as follows:

$$\Delta V_{ICI}^{(i,j)} = k_x \Delta V_t^{(i,j-1)} + k_x \times V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (I)$$

where $\Delta V_t^{(w,b)}$ is the change in $V_t$ voltage of agressor cell (w,b), $\Delta V_{ICI}^{(i,j)}$ is the change in $V_t$ voltage of target cell (i,j) due to ICI and $k_x, k_y$, and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell when all pages in a wordline are read, or with two or more bits when only one page in a wordline is read, or as a value quantized to a hard voltage level with the same resolution as the number of bits stored per cell (e.g., 3 bits for 3 bits/cell flash) when all pages in a wordline are read, or a value quantized to one hard bit when only one page in a wordline is read.

For a more detailed discussion of distortion in flash memory devices, see, for example, J. D. Lee et al.: "Effects of Floating-Gate Interference on NAND Flash Memory Cell Operation," IEEE Electron Device Letters, 264-266 (May 2002) or Ki-Tae Park, et at, "A Zeroing Cell-to-Cell Interference Page Architecture With Temporary LSB Storing and Parallel MSB Program Scheme for MLC NAND Flash Memories," IEEE J. of Solid. State Circuits, Vol, 43, No. 4, 919-928, (April 2008), each incorporated by reference herein.

Figure 4:
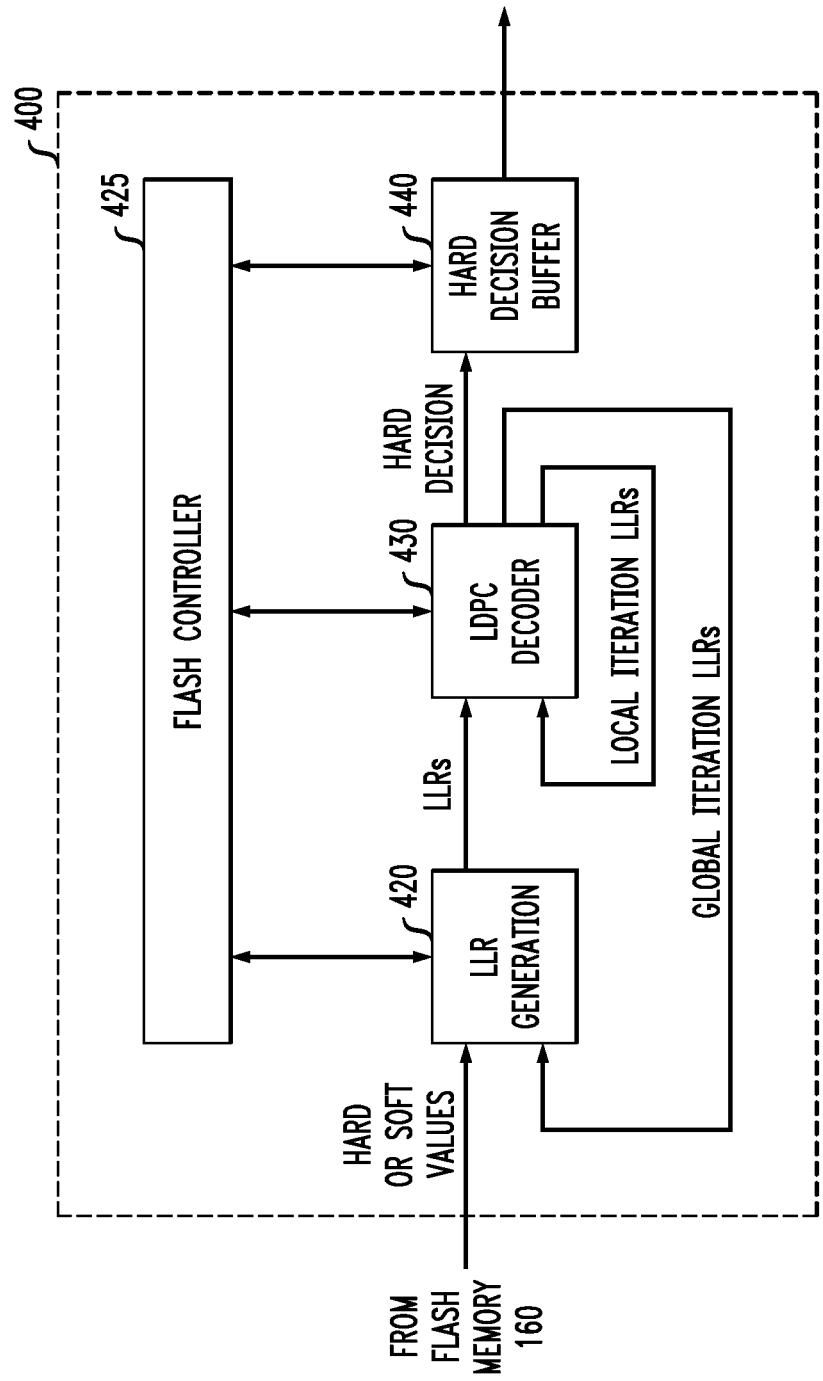
FIG. 4 is a schematic block diagram of an exemplary implementation of a flash memory system incorporating detection and decoding techniques in accordance with aspects of the present invention.

FIG. 4 is a schematic block diagram of an exemplary implementation of a flash memory system 400 incorporating detection and decoding techniques in accordance with aspects of the present invention. As shown in FIG. 4, one or more read values are obtained from the memory array 170 of the flash memory 160. The read values may be, for example, a hard value or a soft value. In a normal mode, for example a read value is obtained for at least one bit in given page.

In a given processing mode, such as a normal mode or a recovery mode, an exemplary LLR generation block 420 processes the read values from the flash memory 160, such as single bit hard values and/or quantized multi-bit soft values, and generates LLR values that are applied to an exemplary LDPC decoder 430. The LLR generation performed by the exemplary LLR generation block 420 for each mode of the exemplary detection and decoding is discussed further below in a section entitled "LLR generation."

An exemplary flash controller 425 implements one or more detection and decoding processes (discussed further below in conjunction with FIGS. 5-7) that incorporate aspects of the present invention. In addition, as discussed further below, an exemplary LDPC decoder 430 processes the LLRs generated by the exemplary LLR generation block 420 and provides hard decisions that are stored in hard decision buffers 440.

As discussed further below, the exemplary LDPC decoder 430 can iteratively decode the LLR values, e.g., until the read values are successfully decoded. Iterations inside the LDPC decoder 430 are called local iterations. In these local iterations, LLRs are being updated inside the LDPC decoder using one or more iterations of a message passing algorithm. In addition, as discussed further below, in an exemplary recovery mode, the exemplary LLR generation block 420 and the exemplary LDPC decoder 430 can globally iterate until the read values are successfully decoded. In a global iteration, the LLR generation block 420 provides LLRs to the LDPC decoder 430. After local iterations within the LDPC decoder 430, the LDPC decoder 430 then provides updated LLRs to the LLR generation block 420. The LLR generation block 420 uses these LLRs from the LDPC decoder 430 to compute updated LLRs, which are provided to the LDPC decoder 430. One loop of LLR updates through the LLR generation block 420 and LDPC decoder 430 is called one global iteration. In an iterative detection and decoding system, several local and/or several global iterations are being performed until the data corresponding to a codeword has been successfully detected and decoded. For a more detailed discussion of iterative detection and decoding using local and global iterations, see, for example, U.S. patent application Ser. No. 13/063,888, filed Mar. 14, 2011, entitled "Methods and Apparatus for Soft Data Generation in Flash Memories," incorporated by reference herein.

Figure 5:
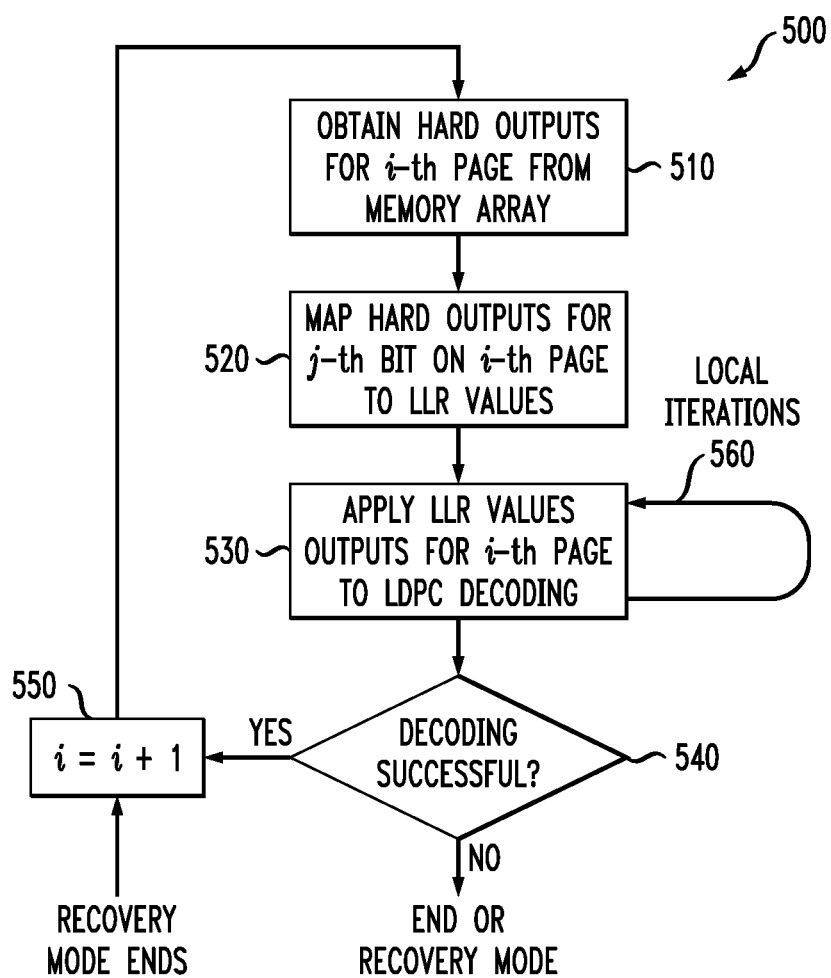
FIG. 5 is a flow chart describing an exemplary normal mode detection and decoding process.

FIG. 5 is a flow chart describing an exemplary binary normal mode detection and decoding process 500 incorporating aspects of the present invention. Generally, during a normal mode, the flash memory 160 provides only hard outputs. As indicated above, a page-wise access scheme is employed during the normal mode such that additional information on other pages in the same wordline is not required. In addition, the LDPC decoder 430 does not employ global iterations. Thus, as discussed hereinafter, binary LLRs are obtained using calculation based on observed data or error statistics of the current page.

As shown in FIG. 5, the exemplary normal mode detection and decoding process 500 initially obtains hard outputs for the i-th page from the memory array 170 during step 510. Thereafter, the exemplary normal mode detection and decoding process 500 employs the LLR generation block 420 to map the hard outputs for the j-th bit on i-th page to LLR Values during step 520. This mapping operation is either implemented using a look-up table or mathematical operations, where LLRs are computed based on the hard outputs. For a more detailed discussion of suitable techniques for LLR Generation during a normal mode, see, for example, U.S. patent application Ser. No. 13/063,551, filed Dec. 31, 2012, entitled "Multi-Tier Detection and Decoding in Flash Memories;" U.S. patent application Ser. No. 13/731,766, filed Dec. 31, 2012, entitled "Detection and Decoding in Flash Memories Using Correlation of Neighboring Bits;" and/or U.S. patent application Ser. No. 13/063,888, filed Mar. 14, 2011, entitled "Methods and Apparatus for Soft Data Generation in Flash Memories," each incorporated by reference herein.

The generated LLR values for the i-th Page are applied during, step 530 to the LDPC decoder 430 for message passing (MP) decoding. The LDPC decoder 430 optionally employs local iterations 560.

A test is performed during step 540 to determine if the decoding was successful. If it is determined during step 540 that the decoding was successful, then the page counter i is incremented during step 550 to process the next page. If, however, it is determined during step 540 that the decoding, was not successful, then the exemplary normal mode detection and decoding process 500 ends or initiates a binary recovery mode 600 (FIG. 6) or a non-binary recovery mode 700 (FIG. 7).

At the beginning of the life cycle of the flash device 160 or for good blocks within the flash device 160, when errors are generally less severe, binary recovery mode 600 is faster and provides sufficient error rate performance. At the end of the life cycle of the flash device 160, however, or for had blocks within the flash device 160, bit errors are more severe and there is significantly more correlation between pages on the same wordline. Hence, non-binary recovery mode 700 is more desirable than binary recovery mode 600, as error correlation is accounted for both at detection and non-binary decoding. Moreover, non-binary recovery mode 700 generates hard decisions for all pages on the same wordline at the same time, which is useful in sequential reading modes of operation. For certain situations such as at the end of the life cycle of a flash memory device 160 or for had blocks within a flash memory device, the flash control system may enter non-binary recovery mode 700 directly without first attempting the normal mode detection and decoding process 500 or binary recovery mode detection and decoding process 600.

As discussed further below in conjunction with FIG. 6, when the recovery mode 600, 700 ends, program control returns to step 550 to process the next page.

Figure 6:
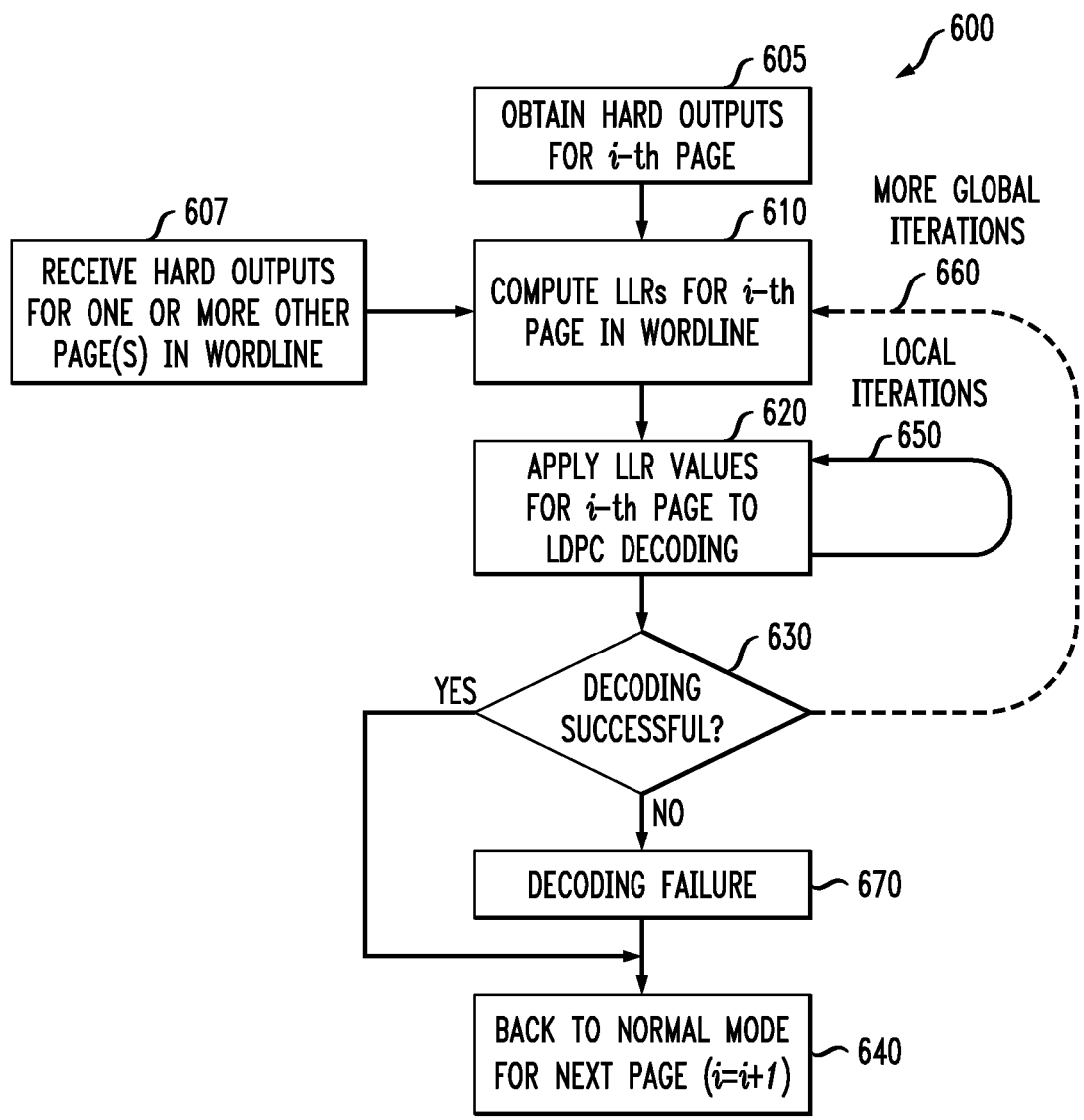
FIG. 6 is a flow chart describing an exemplary binary recovery mode detection and decoding process.
Figure 7:
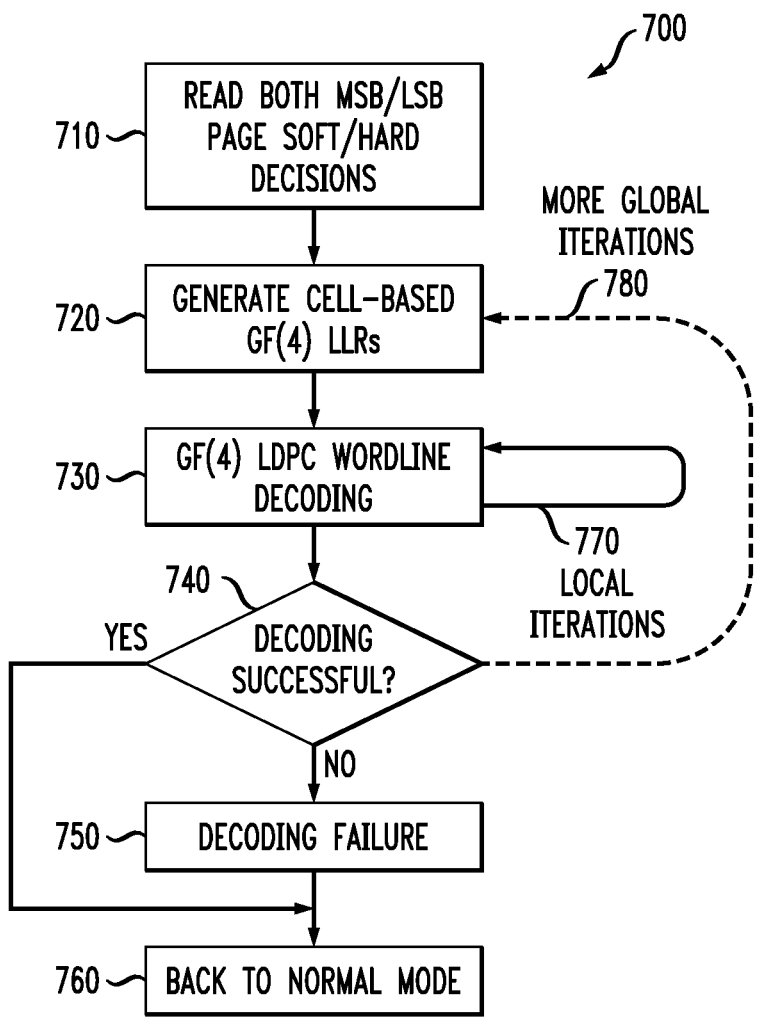
FIG. 7 is a flow chart describing an exemplary alternative non-binary recovery mode detection and decoding process.

FIG. 6 is a flow chart describing an exemplary binary recovery mode detection and decoding process 600 incorporating aspects of the present invention. Generally, during a recovery mode, the flash memory 160 provides only hard outputs using wordline (cell) access techniques, where other pages in the wordline are read. LLRs are computed based on hard outputs from the current page i and one or more other pages in the same word line. These LLRs are utilized by the exemplary binary recovery mode detection and decoding process 600. In addition, the LDPC decoder 430 employs one or more global iterations (optionally programmable).

As shown in FIG. 6, the exemplary binary recovery mode detection and decoding process 600 initially obtains hard outputs for the i-th page (step 605) and one or more other pages in the same wordline (step 607). Hard outputs for the i-th page may still be available from step 510 and may therefore be reused. Then, the exemplary first recovery mode detection and decoding, process 600 computes the LLRs for the i-tb page in the current wordline based on hard outputs for the current i-th page and one or more other pages in the same wordline during step 610. For a more detailed discussion of suitable techniques for LLR Generation during a binary recovery mode, see, for example, U.S. patent application Ser. No. 13/063,551, filed Dec. 31, 2012, entitled "Multi-Tier Detection and Decoding in Flash Memories;" U.S. patent application Ser. No. 13/731,766, filed Dec. 31, 2012, entitled "Detection and Decoding in Flash Memories Using Correlation of Neighboring Bits;" and/or U.S. patent application Ser. No. 13/063,888, filed Mar. 14, 2011, entitled "Methods and Apparatus for Soft Data Generation in Flash Memories," each incorporated by reference herein.

The LLR values for the i-th page are applied to the LDPC decoder 430 during step 620, optionally using local iterations 650.

A convergence test is performed during step 630 to determine if the decoding was successful. If it is determined during step 630 that the decoding was successful, then the page counter i is incremented during step 640 to process the next page in normal mode 500. If, however, it is determined during step 630 that the decoding was not successful, additional global iterations 660 are optionally performed between the LLR generation block 420 and LDPC decoder 430. The global iterations 660 are performed until the aforementioned convergence test indicates that decoding is now successful or the maximum allowable number of global iterations is reached.

Then, if it is determined during step 630 that the decoding was not successful and global iterations have been completed, then the exemplary binary recovery mode detection and decoding process 600 declares a decoding failure of the current page during step 670. Program control then proceeds to step 640 to process the next page in normal mode 500. Alternatively, the exemplary binary recovery mode detection and decoding process 600 initiates a non-binary recovery mode 700 (FIG. 7) to recover the current page that produced a decoding failure during process 600.

FIG. 7 is a flow chart describing an exemplary non-binary recovery mode detection and decoding process 700 incorporating aspects of the present invention. Generally, during a non-binary recovery mode, the flash memory 160 provides hard or soft outputs for all pages in the wordline (such as MSB and LSB pages) using wordline (cell) access techniques. In addition, the LDPC decoder 430 employs one or more global iterations (optionally programmable).

As shown in FIG. 7, the exemplary non-binary recovery mode detection and decoding process 700 initially reads both pages in the current wordline obtaining either hard or soft read values during step 710, for an exemplary two-level cell. Thereafter, the process 700 generates cell-based Galois Field GF(4) LLRs during step 720, as discussed further below in a section entitled "Non-Binary LLR Generation for Recovery Mode." The exemplary GF(4) multi-level lifts for each cell capture the intra-cell correlations, which are then passed to a wordline LDPC decoder.

it is noted that an exemplary GF(4) code is applied for a two-bit-per-cell flash memory providing four distinct symbols), while a GF(8) code would be applied, for a three-bit-per-cell flash memory (providing eight distinct symbols). More generally, a GF($2^n$) code would be applied for an n-bit-per-cell flash memory (providing $2^n$ distinct symbols). As indicated above, aspects of the present invention provide joint decoding on a non-binary field of LSB and MSB pages of a given wordline in the recovery mode, while also being able to decode LSB and MSB pages independently on the binary field in the normal mode. As used herein, the term "non-binary" shall apply to any multi-level cell, where the number of distinct symbols is greater than two. In other embodiments, non-binary decoding of multiple pages in several aggressor and victim wordlines is performed in a more aggressive recovery mode, where if in aggressor wordlines are read in addition to the current wordline, a GF($2^{n \times (m+1)}$) decoder is employed to mitigate the ICI caused distortion.

The joint LLR values for both LSB and MSB pages of the wordline are applied to the LDPC decoder 430 during step 730, optionally using local iterations 770. As discussed further below, the exemplary LDPC decoder 430 employs GF(4) non-binary wordline message passing (MP) decoding, or in general, a GF($2^L$) MP decoding is employed when L pages are decoded jointly. For a more detailed discussion of suitable techniques for non-binary MP decoding, see, for example, M, C. Davey and D. J. C. MacKay, "Low Density Parity Check Codes over GF(q)," IEEE Communications Letters, vol. 2, 165-167 (June 1998), incorporated by reference herein.

A convergence test is performed during step 740 to determine if the decoding was successful. If it is determined during step 740 that the decoding was successful, then the page counter i is incremented during step 760 to process the next page in normal mode 500. If, however, it is determined during step 740 that the decoding was not successful, additional global iterations 780 are optionally performed between the LLR generation block 420 and LDPC decoder 430. The global iterations 780 are performed until the aforementioned convergence test indicates that decoding, is now successful or the maximum allowable number of global iterations is reached.

Then, if it is determined during step 740 that the decoding was not successful and global iterations have been completed, then the exemplary non-binary recovery mode detection and decoding process 700 declares a decoding failure of the current page during step 750. Program control then proceeds to step 760 to process the next page in normal mode 500.

Figure 8:
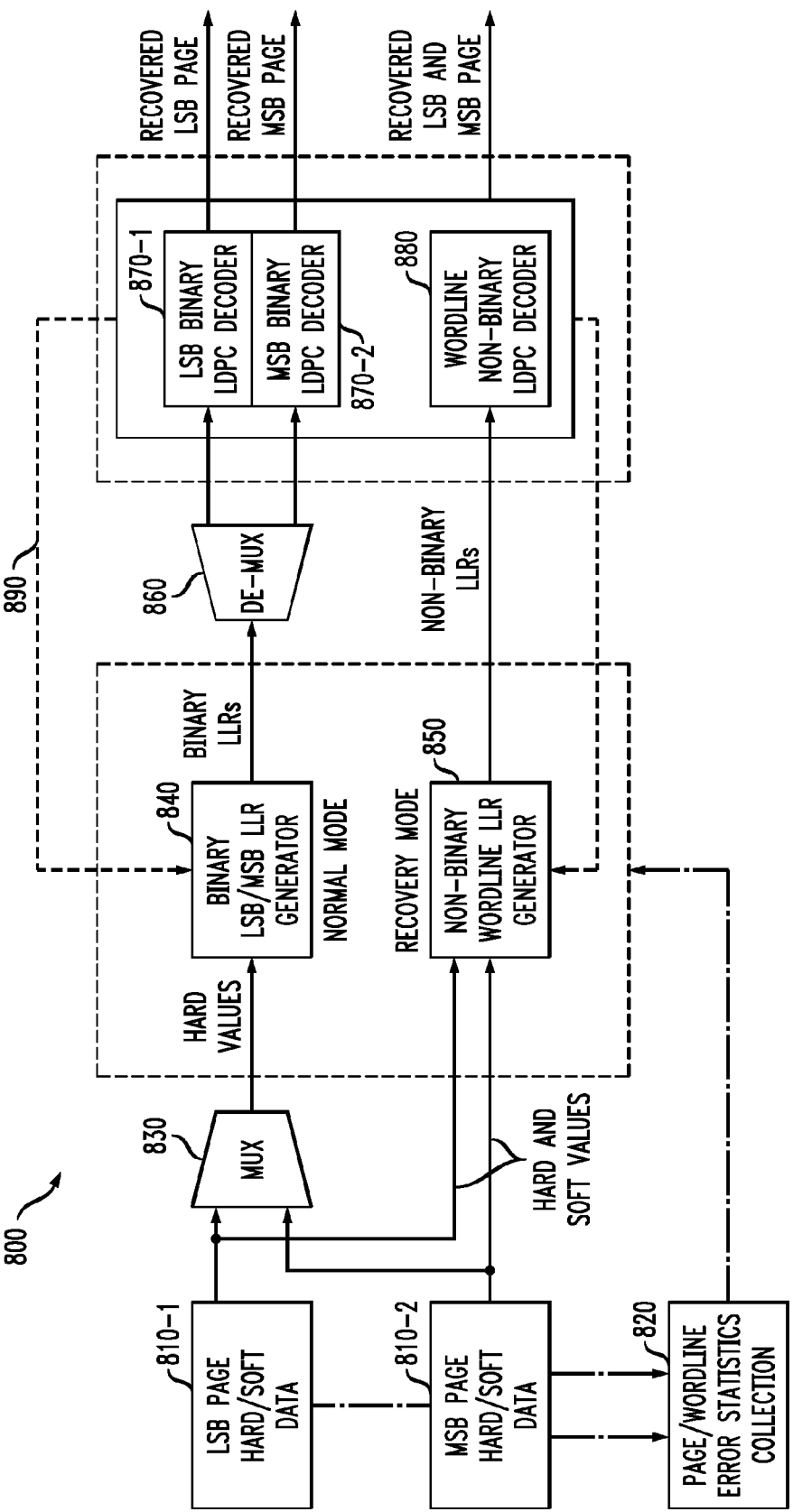
FIG. 8 is a block diagram of an exemplary hybrid detection and decoding system incorporating aspects of the present invention.

FIG. 8 is a block diagram of an exemplary hybrid detection and decoding system 800 incorporating aspects of the present invention. As discussed hereinafter, the exemplary hybrid detection and decoding system 800 performs binary decoding of individual pages in a normal mode and non-binary joint decoding of the pages in a wordline in a recovery mode.

As shown in FIG. 8, the exemplary hybrid detection and decoding, system 800 processes MSB and MSB page hard data 810-1, 810-2. The LSB and MSB page hard data 810-1, 810-2 is processed by a page/wordline error statistics collection block 820 to collect the error statistics that are used for LLR generation, as well as used for detection and decoding. For a more detailed discussion on the collection of error statistics for LLR generation and LDPC decoding, see, for example, U.S. patent application Ser. No. 13/063,888, filed Mar. 14, 2011, entitled "Methods and Apparatus for Soft Data Generation in Flash Memories," incorporated by reference herein.

In a normal mode, the LSB and MSB page hard data 810-1, 810-2 are processed independently. A multiplexer 830 selects one of the LSB and MSB page hard data 810-1, 810-2 at a time, under control of the flash controller 425. A binary LSB/MSB LLR generator 840 processes the hard values 810-1, 810-2 for a normal mode to generate corresponding binary LLRs. A demultiplexer 860 separates the binary LLRs for the LSB and MSB pages, under control of the flash controller 425 and applies them to a corresponding LSB binary LDPC decoder 870-1 that generates the recovered LSB page or the corresponding MSB binary LDPC decoder 870-2 that generates the recovered MSB page. In an alternative embodiment, a single LDPC decoder is used to generate the recovered LSB or MSB pave based on the corresponding binary LLRs, that is the LSB page and MSB page share a LDPC decoder.

In addition, in a non-binary recovery mode, a non-binary wordline LLR generator 850 jointly processes hard and/or soft values for both LSB and MSB pages to generate the non-binary LLRs. The non-binary LLRs are applied to a wordline non-binary LDPC decoder 880 that jointly processes both pages of the wordline to generate the recovered LSB and MSB pages. In an alternative embodiment, the binary LDPC decoders 870 and non-binary LDPC decoder 880 may share processing functions or processing hardware.

As shown in FIG. 8, global iterations 890 are performed between the binary LSB/MSB LLR venerator 840 and/or non-binary wordline LLR venerator 850 and the LSB/MSB binary LDPC decoders 870 and/or wordline non-binary LDPC decoder 880.

Figure 9:
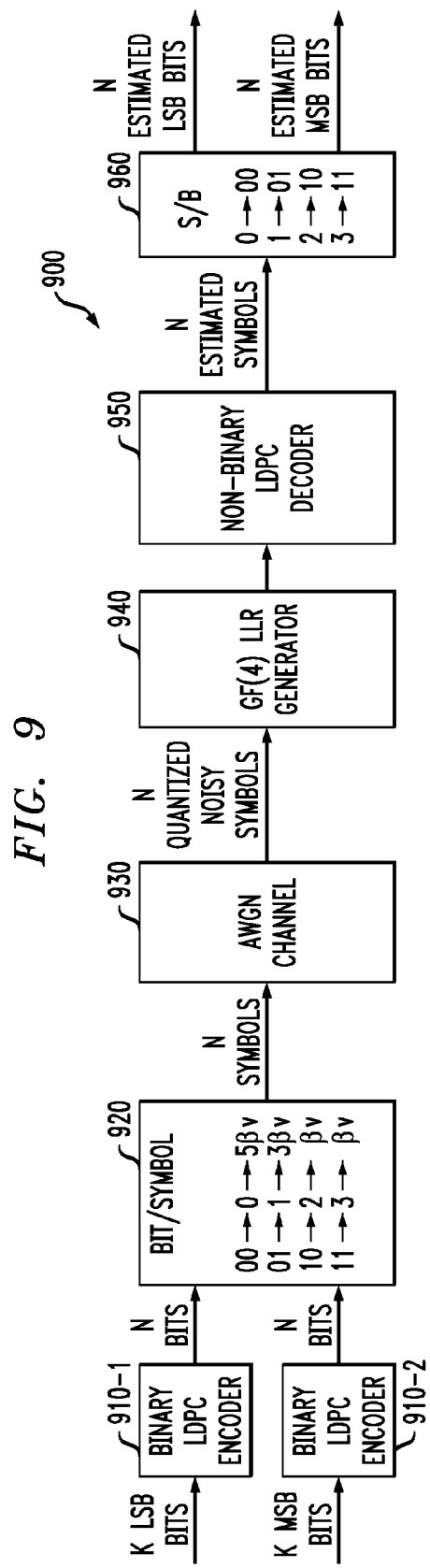
FIG. 9 is a simplified block diagram of an exemplary hybrid encoding and decoding system incorporating aspects of the present invention.

FIG. 9 is a simplified block diagram of an exemplary hybrid encoding and decoding system 900 incorporating aspects of the present invention. As discussed hereinafter, the exemplary hybrid encoding and decoding system 900 performs (i) independent encoding of individual pages; and (ii) independent binary decoding and/or joint non-binary decoding of the pages in a wordline in a recovery mode, in a similar manner to FIG. 8.

As shown in FIG. 9, the exemplary hybrid encoding and decoding system 900 processes K LSB bits and K MSB bits that are applied to corresponding binary LDPC Encoders 910-1 and 910-2 that each generate N bits, in which LDPC Encoders 910-1 and 910-2 use exactly the same code generator matrix. The generated 2N bits are applied to a bit-to-symbol (B/S) converter 920 that generates N symbols. For example, under a Gray encoding scheme, the following exemplary bit mapping can be employed:

00→0→5 β V
01→1→3 β V
10→2→β V
11→3→−β V

In an equivalent communications model of the flash channel in the non-binary recovery mode, the N symbols are transferred through an AWGN Channel 930 and quantized to generate N noisy symbols. An LLR generator 940 maps those quantized N symbols into N GF(4) LLRs, that are decoded by a non-binary LDPC decoder 950 that processes the N GF(4) LLRs to generate N estimated symbols.

The N estimated symbols are applied to a symbol-to bit (S/B) converter 960 that generates N estimated LSB bits and N estimated MSB bits.

The exemplary embodiment in FIG. 9 uses two binary encoders to effectively apply a non-binary code to a two-bit-per-cell flash, and each symbol carries 2 bits. For n-bit-per-cell flash, n encoders apply a non-binary code, where each symbol effectively carries n bits when decoded in recovery mode 700, while if the normal mode 500 is applied then each of the n bits are decoded separately.

Since pages are written independently by the binary LDPC Encoders 910-1 and 910-2, larger buffers or added delays are not required that limit the usability of competing schemes that apply error correction codes across pages. Also the non-binary LDPC decoder could share most of the hardware with the individual binary LDPC decoders because of the scheme of matrix mappings of Galois field elements during LDPC code construction, which is discussed further below. Finally, also due to this hardware sharing, the decoder area is similar to the binary constituent decoders.

Figure 10:
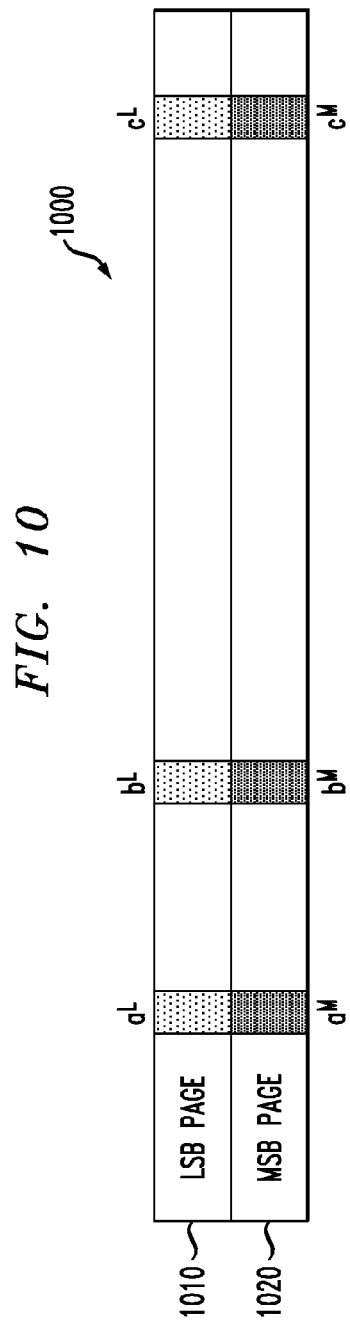
FIG. 10 illustrates an exemplary two-level cell memory device having an exemplary LSB and MSB pages within each wordline.

To illustrate how the Galois field elements of the non-binary LDPC code arise from the binary LDPC codes written to the flash. FIG. 10 shows an exemplary two-bit-per-cell memory device 1000 having an exemplary LSB or lower page 1010 and MSB or upper page 1020 within each wordline. As shown in FIG. 10, each cell, such as cells a, h and c, comprise an LSB bit, such as LSB bits $a^L$, $b^L$ and $c^L$ and an MSB bit, such as MSB bits $a^M$, $b^M$ and $c^M$.

As indicated above, aspects of the invention recognize that as long as pages are encoded by the same binary generator matrix, the corresponding individual parity check matrices for decoding can be joined into a single non-binary parity check matrix given that all its non-zero elements are the unity Galois field element.

For the LSB and MSB bits of FIG. 10, the binary LSB LDPC parity check equation can be expressed as follows:

$$a^L \oplus b^L = c^L,$$

and the binary MSB LDPC parity check equation can be expressed as follows:

$$a^M \oplus b^M = c^M.$$

In addition, the corresponding non-binary cell parity check equation can be expressed as follows:

$$\begin{bmatrix} a^L \\ a^M \end{bmatrix} \oplus \begin{bmatrix} b^L \\ b^M \end{bmatrix} = \begin{bmatrix} c^L \\ c^M \end{bmatrix} \Leftrightarrow \overline{A} \oplus \overline{B} = \overline{C},$$

where each vector, such as $\overline{A}, \overline{B}, \overline{C}$ (a 2-by-1 array) comprises a GF element.

For the LSB and MSB bits of FIG. 10, the LSB page binary LDPC parity check matrix can be expressed as follows:

$$\begin{array}{ccc} a^L & b^L & c^L \end{array}$$
$$\begin{bmatrix} \overline{1} & \cdots & \overline{1} & \cdots & \overline{1} \\ \vdots & & \ddots & & \vdots \\ \cdots & & \cdots & & \cdots \end{bmatrix},$$

and the MSB page binary LDPC parity check matrix can be expressed as follows:

$$\begin{array}{ccc} a^M & b^M & c^M \end{array}$$
$$\begin{bmatrix} \overline{1} & \cdots & \overline{1} & \cdots & \overline{1} \\ \vdots & & \ddots & & \vdots \\ \cdots & & \cdots & & \cdots \end{bmatrix},$$

When the LSB and MSB LDPC codes are the same, the non-binary cell GF(4) LDPC parity check matrix (an all ones matrix) can be expressed as follows:

$$\begin{array}{ccc} \overline{A} & \overline{B} & \overline{C} \end{array}$$
$$\begin{bmatrix} \overline{1} & \cdots & \overline{1} & \cdots & \overline{1} \\ \vdots & & \ddots & & \vdots \\ \cdots & & \cdots & & \cdots \end{bmatrix},$$

where each GF element "$\overline{1}$" corresponds to the following 2-by-2 array of binary elements:

$$\begin{bmatrix} 1 & 0 \\ 0 & 1 \end{bmatrix}.$$

Hence, if the size of the parity check matrix of either the LSB or MSB LDPC codes is K×N, the binary image of the resulting non-binary wordline-matched LDPC code is 2K×2N.

In this manner, the parity check matrix of the non-binary LDPC code protecting the wordline arises naturally from the parity check matrix of the binary codes protecting the pages without the need for added parity bits that would waste more spare area.

Non-Binary LLR Generation for Recovery Mode

Figure 11:
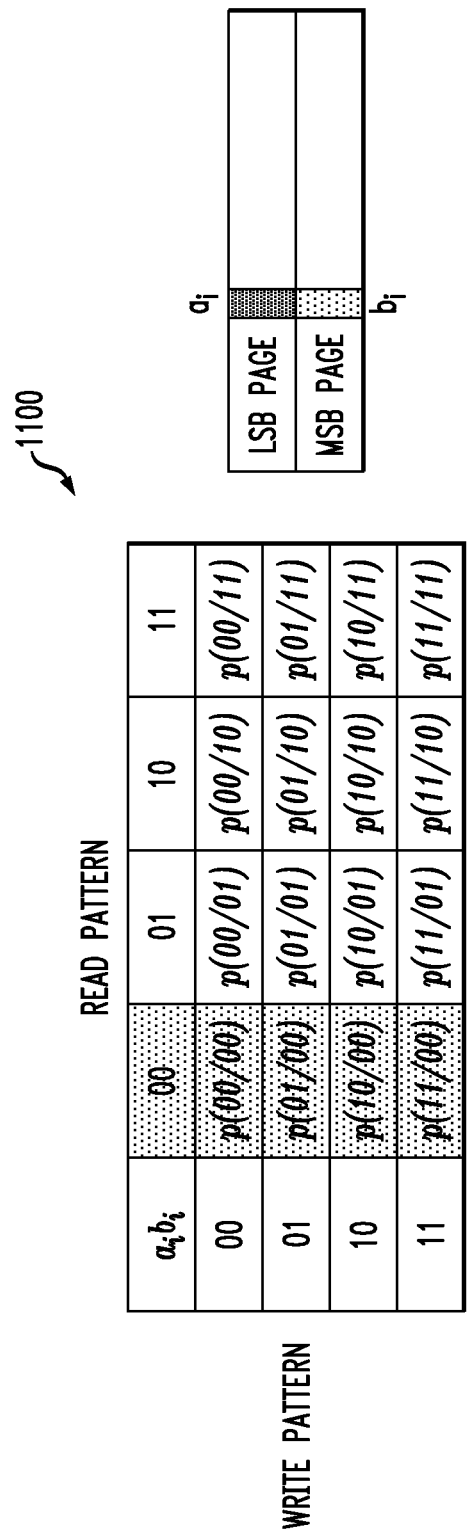
FIG. 11 illustrates an exemplary bit transition probability table that records collected intra-wordline statistics indicating a transition probability for a given cell value.

FIG. 11 illustrates an exemplary bit transition probability table 1100 that records collected intra-wordline statistics indicating a transition probability for a given pair of bits $a_i b_i$ that represent one cell in a wordline. $a_i$ and $b_i$ refer to the lower (or LSB) and upper (or MSB) page bit of cell i The size of the transition probability table 1100 grows exponentially in the number of pages in a wordline, or in one embodiment it grows exponentially in the total number of pages in all aggressor wordlines (that are considered and the current wordline. The error statistics in the exemplary bit transition probability table 1100 are used to compute 2-bit joint GF(4) LLRs that correspond to the 4 possible states of a flash cell. For more information on bit transition probability tables, see U.S. patent application Ser. No. 13/731,766, filed Dec. 31, 2012, entitled "Detection and Decoding in Flash Memories Using Correlation of Neighboring Bits," incorporated by reference herein.

The exemplary non-binary recovery mode detection and decoding process 700 uses wordline (cell) access techniques, where the other pages in the wordline are read to generate the corresponding LLRs. in the exemplary embodiment, the LLRs are calculated based on data. or error statistics of the adjacent bits in the same wordline, or based on data or error statistics of other aggressor wordlines that are being considered. The data or error statistics can be collected using reference cells or past. LDPC decisions of the pages in the wordline. For a discussion of suitable error statistics collection techniques, see, for example, U.S. patent application Ser. No. 13/063,895, filed Mar. 14, 2011, entitled "Methods and Apparatus for Soft Data Generation for Memory Devices Using Reference Cells;" and/or U.S. Pat. application Ser. No. 13/063,899, filed Mar. 14, 2011, entitled "Methods and Apparatus for Soft Data Generation for Memory Devices Using Decoder Performance Feedback," each incorporated by reference herein.

The transition probability table 1100 records a probability that each possible pattern was written to bits $a_i b_i$ in cell i given that each possible pattern was read (i.e., the reliability of making a decision that a pattern was written given that a pattern was read in the normal mode 500). For example, the term "p(10/00)" indicates the probability that the pattern '10' was written to bits $a_i b_i$ given that pattern '00' was read (or the reliability of making a decision '10' given '00' was read in the normal mode). This table can also be used for bits in other cells, such as cell i+1 as would be apparent to a person of ordinary skill in the art. It is again noted that both pages in the wordline are read in a non-binary recovery mode.

The statistics in the transition probability table 1100 can be employed, to compute LLRs as follows. Given that a particular pattern was read, such as a pattern of '00' the corresponding symbol LLRs can be computed as, where C is some normalization constant, $\lambda(a_i b_i = 00|00) = \log[p(00/00)] - C, \lambda(a_i b_i 01|00) = \log[p(01/00)] - C;$ $\lambda(a_i b_i = 10|00) = \log[p(10/00)] - C, \lambda(a_i b_i 11|00) = \log[p(11/00)] - C;$ For a discussion of LLR generation conditioned on several designated neighboring bits, see, U.S. patent application Ser. No. 13/731,766, filed Dec. 31, 2012, entitled "Detection and Decoding in Flash Memories Using Correlation of Neighboring Bits," incorporated by reference herein.

In a further variation, the bit transition probability table 1100 can be a function of one Of more performance factors, such as endurance, number of program/erase cycles, number of read cycles, retention time, temperature, temperature changes, process corner, ICI impact, location within the memory array 170, location of wordline and/or page from which the read values are obtained, location of page within wordline from which the read values are obtained and a pattern of aggressor cells. One or more of the performance factors can be varied for one or more different bits within a cell, different pages within as wordline, different bit lines or different hard read data values. For a more detailed discussion of suitable techniques for computing a log likelihood ratio for memory devices based on such performance factor adjustments, see, for example, international Patent Application Serial No. PCT/US09/59069, filed Sep. 30, 2009, entitled "Methods and Apparatus for Soft Data Generation for Memory Devices Based on Performance Factor Adjustment," incorporated by reference herein.

In a further variation, the 2-bit joint GF(4) LLRs can be computed based on a uniform fixed or non-uniform fixed LLR mapping. Generally, the mapping of LLRs follows two schemes. The LLR mapping can be based on a symbol independent mapping 1200 (FIG. 12A) or a. symbol dependent mapping 1250 (FIG. 12B). As indicated above, in the exemplary Gray encoding scheme for 2-bit cell flash memory, the following exemplary mapping of bits to voltage, states can be employed: 00→0; 01→1; 10→2; and 11→3. In FIGS. 12A and 12B, the hard read decision of cell j is expressed as $\lambda_j^\alpha$; $\alpha$ is a positive constant and a is a state label ("11", "01", "00", or "10"), which can also be expressed as an alternative state label 3, 1, 0, or 2).

The uniform mapping of (FIG. 12A) is used when all possible errors are equally likely, while the non-uniform mapping of (FIG. 12B) corresponds to the case when errors are more likely between adjacent cell states and in an asymmetric manner. A person with ordinary skill in the art can modify these fixed mapping to any arbitrary mappings that best fit the error behavior of the underlying channel in order to improve the decoder convergence probability as one possible metric.

The four exemplary GF(4) LLR values (that is symbol LLRs) for a cell j (or bits $a_i b_i$) can be obtained using soft decisions, or quantized soft decisions obtained through several voltage read retries at different reference voltages (to obtain quantized estimates of the voltage stored on the cell), as follows:

$$\lambda_j^{11} = \log P(a = 11 | r_j) = -\frac{(r_j - \mu_{11})^2}{2\sigma^2} + K$$

$$\lambda_j^{00} = \log P(a = 00 | r_j) = -\frac{(r_j - \mu_{00})^2}{2\sigma^2} + K$$

$$\lambda_j^{01} = \log P(a = 01 | r_j) = -\frac{(r_j - \mu_{01})^2}{2\sigma^2} + K$$

$$\lambda_j^{10} = \log P(a = 10 | r_j) = -\frac{(r_j - \mu_{10})^2}{2\sigma^2} + K$$

where j indicates the jth cell; $\alpha$ indicates the state ("11", "01", "00", or "10"); $r_j$ indicates the read soft decision (or quantized estimate); $\mu_\alpha$ indicates the mean of the Gaussian distribution corresponding to state $\alpha$; $\sigma^2$ indicates the variance of Gaussian distribution corresponding to state $\alpha$; K indicates an arbitrary real constant and $\lambda_j^\alpha$ indicates the LLR value for jth cell at state $\alpha$. For a more detailed discussion of how read retries at difference reference voltages are used to obtain quantized soft decision, see, U.S. patent application Ser. No. 13/063,551, filed Dec. 31, 2012, entitled "Multi-Tier Detection and Decoding in Flash Memories," incorporated by reference herein.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read front or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for processing data from a flash memory device, comprising:
obtaining one or more read values for a plurality of bits from one or more pages of said flash memory device;
converting said one or more read values for said plurality of bits to a non-binary log likelihood ratio based on a probability that a given data pattern was written to said plurality of bits when a particular pattern was read from said plurality of bits; and
jointly decoding said plurality of bits using said non-binary log likelihood ratio, wherein said panes are encoded independently.

2. The method of claim 1, wherein said non-binary log likelihood ratio comprises one or more of a log-likelihood ratio, an approximation of a log-likelihood ratio and a reliability value that measures the reliability of a bit decision.

3. The method of claim 1, wherein said pages are encoded independently using a same binary generator matrix.

4. The method of claim 3, wherein said step of jointly decoding said plurality of bits uses a single non-binary parity check matrix having non-zero elements comprised of unity Galois field elements.

5. The method of claim 4, wherein said single non-binary parity check matrix is based on said binary generator matrix.

6. The method of claim 1, wherein said non-binary log likelihood ratio comprises a memory cell-based Galois Field value that captures intra-cell correlations.

7. The method of claim 1, wherein said joint decoding comprises a Galois Field non-binary wordline-matched message passing decoding technique.

8. The method of claim 1, wherein said method comprises a recovery mode that is initiated if a normal operating mode does not successfully decode one or more of said plurality of bits for a given page.

9. The method of claim 8, wherein said normal operating mode decodes each page independently of other pages.

10. The method of claim 1, wherein said plurality of pages are from a given wordline.

11. The method of claim 1, wherein said plurality of pages are from different wordlines.

12. The method of claim 1, wherein said probability that said given data pattern was written to said plurality of bits when said particular pattern was read from said plurality of bits is obtained from one or more tables.

13. The method of claim 12, wherein said given data pattern comprises a plurality of bits in a given memory cell.

14. The method of claim 12, wherein said non-binary log likelihood ratios are computed as follows, given that a particular pattern was read from a cell:

$$\lambda(a_i b_i=00|00)=\log [p(00/00)]-C, \lambda(a_i b_i 01|00)=\log [p(01/00)]-C;$$

$$\lambda(a_i b_i=10|00)=\log [p(10/00)]-C, \lambda(a_i b_i 11|00)=\log [p(11/00)]-C.$$

15. The method of claim 1, wherein said probability that said given data pattern was written to said plurality of bits when said particular pattern was read from said plurality of bits is based on one or more reference cells.

16. The method of claim 1, wherein said probability that said given data pattern was written to said plurality of bits when said particular pattern was read from said plurality of bits is based on one or more prior decoded decisions.

17. The method of claim 1, wherein said probability that said given data pattern was written to said plurality of bits when said particular pattern was read from said plurality of bits is based on one or more performance factors of said flash memory device.

18. The method of claim 1, wherein said method is performed by a hybrid detection and decoding system that, performs binary decoding of individual pages in a normal mode and said non-binary joint decoding of the pages in a wordline in a recovery mode.

19. The method of claim 1, wherein said non-binary log likelihood ratios are computed. based on one or more of a fixed uniform LLR mapping and a fixed non-uniform LLR mapping.

20. The method of claim 1, wherein said non-binary log likelihood ratios are computed based on one or more of soft decisions and quantized soft decisions obtained using a plurality of voltage read retries at a plurality of reference voltages.

21. A tangible machine-readable recordable storage medium for processing data from a flash memory device, wherein one or more software programs when executed by one or more processing devices implement the steps of the method of claim 1.

22. A flash memory system, comprising:
a reliability unit for converting one or more read values for a plurality of bits from one or more pages of a flash memory device to a non-binary log likelihood ratio based on a probability that a given data pattern was written to said plurality of bits when a particular pattern was read from said plurality of bits; and
a non-binary decoder for jointly decoding said plurality of bits using said non-binary log likelihood ratio, wherein said pages are encoded independently.

23. The flash memory system of claim 22, further comprising one or more binary LDPC decoders for generating one or more recovered pages based on one or more binary LLRs.

24. The flash memory system of claim 23, wherein said one or more binary LDPC decoders share one or more hardware elements with said non-binary decoder.

25. The flash memory system of claim 22, wherein said non-binary decoder jointly processes a plurality of pages of a wordline to generate one or more recovered pages.

26. The flash memory system of claim 22, further comprising one or more binary encoders that apply one or more non-binary codes to generate one or more symbols.

27. The flash memory system of claim 22, further comprising a plurality of binary encoders that share one or more hardware elements with one another.

* * * * *

UNITED STATES PATENT AND TRADEMARK OFFICE
CERTIFICATE OF CORRECTION

PATENT NO. : 9,086,984 B2
APPLICATION NO. : 13/755717
DATED : July 21, 2015
INVENTOR(S) : Abdel Hakim S. Alhussien et al.

Page 1 of 3

It is certified that error appears in the above-identified patent and that said Letters Patent is hereby corrected as shown below:

Title Page,

Item (63) Related U.S. Application Data, line 9, after "Mar. 14, 2011," please add --now Pat. No. 9,064,594--.

Item (57) in the Abstract, line 5, replace "converting; the" with --converting the--.

In the Drawings,

Sheet 9, FIG. 9, in the box 920, replace "11→3→βv" with --11→3→-βv--.

In the Specification,

In Column 1, lines 12 and 13, replace "Per-Page Coding;"" with --Per-Page Coding"-- and after "Per-Page Coding"" add --(Now U.S. Patent No. 8,724,381);--.

In Column 1, line 15, replace "Flash Memories;"" with --Flash Memories"-- and after "Flash Memories"" add --(Now U.S. Patent No. 8,830,748);--.

In Column 1, line 21, replace "Performance Feedback;"" with --Performance Feedback"-- and after "Performance Feedback"" add --(Now U.S. Patent No. 8,892,966);--.

In Column 1, line 24, replace "Factor Adjustment;"" with --Factor Adjustment"-- and after "Factor Adjustment"" add --(Now U.S. Patent No. 9,064,594);--.

In Column 2, line 28, replace "hits" with --bits--.

In Column 4, line 3, replace "1 (50" with --160--.

Signed and Sealed this
Nineteenth Day of April, 2016

Michelle K. Lee
*Director of the United States Patent and Trademark Office*

CERTIFICATE OF CORRECTION (continued)
U.S. Pat. No. 9,086,984 B2

In Column 5, line 27, replace "following, discussion" with --following discussion--.

In Column 5, line 50, replace "HER" with --BER--.

In Column 6, line 12, replace "10" with --ICI--.

In Column 6, lines 21 and 22, replace "analyzing, the" with --analyzing the--.

In Column 6, line 26, replace "110" with --310--.

In Column 7, line 35, replace "Mar. 14, 2011" with --Aug. 31, 2011--.

In Column 7, line 36, replace "Flash Memories;"" with --Flash Memories"-- and after "Flash Memories"" add --(Now U.S. Patent No. 8,830,748),--.

In Column 7, line 65, replace "Mar. 14, 2011" with --Aug. 31, 2011--.

In Column 7, line 67, replace "Flash Memories;"" with --Flash Memories"-- and after "Flash Memories"" add --(Now U.S. Patent No. 8,830,748),--.

In Column 8, lines 9 and 10, replace "decoding, was" with --decoding was--.

In Column 8, lines 19 and 29, replace "had" with --bad--.

In Column 8, line 55, replace "i-tb" with --i-th--.

In Column 8, line 65, replace "Mar. 14, 2011" with --Aug. 31, 2011--.

In Column 8, line 66, replace "Flash Memories;"" with --Flash Memories"-- and after "Flash Memories"" add --(Now U.S. Patent No. 8,830,748),--.

In Column 9, line 44, replace "it" with --It--.

In Column 9, lines 45 and 46, replace "distinct symbols)," with --distinct symbols,--.

In Column 9, line 59, replace "where if in" with --where in, if--.

In Column 10, line 15, replace "decoding, is" with --decoding is--.

In Column 10, line 31, replace "decoding, system" with --decoding system--.

In Column 10, line 39, replace "Mar. 14, 2011" with --Aug. 31, 2011--.

In Column 10, line 40, replace "Flash Memories,"" with --Flash Memories"-- and after "Flash Memories"" add --(Now U.S. Patent No. 8,830,748),--.

CERTIFICATE OF CORRECTION (continued)
U.S. Pat. No. 9,086,984 B2

In Column 10, line 55, replace "pave" with --page--.

In Column 10, line 56, replace "a LDPC" with --an LDPC--.

In Column 10, line 67, replace "venerator" with --generator--.

In Column 11, line 1, replace "venerator" with --generator--.

In Column 11, line 33, replace "symbol-to bit" with --symbol-to-bit--.

In Column 11, line 56, replace "flash. FIG. 10" with --flash, FIG. 10--.

In Column 11, line 59, replace "a, h and c" with --a, b and c--.

In Column 12, line 9, replace "panty check" with --parity check--.

In Column 13, line 7, replace "cell i The" with --cell i. The--.

In Column 13, line 11, replace "wordlines (that" with --wordlines that--.

In Column 13, line 23, replace "data. or" with --data or--.

In Column 13, line 27, replace "past. LDPC" with --past LDPC--.

In Column 13, line 35, replace "Performance Feedback,"" with --Performance Feedback"-- and after "Performance Feedback"" add --(Now U.S. Patent No. 8,892,966),--.

In Column 13, line 66, replace "one Of more" with --one or more--.

In Column 14, line 21, replace "a. symbol" with --a symbol--.

In Column 14, line 24, replace "voltage, states" with --voltage states--.

In Column 15, line 63, replace "front" with --from--.

In the Claims,

In Column 16, Claim 2, line 22, replace "a log-likelihood ratio" with --said log-likelihood ratio--.

In Column 16, Claim 13, line 52, replace "a plurality of bits" with --said plurality of bits--.